(12) United States Patent
Koyama et al.

(10) Patent No.: US 9,736,412 B2
(45) Date of Patent: Aug. 15, 2017

(54) SOLID-STATE IMAGING DEVICE, METHOD FOR DRIVING SOLID-STATE IMAGING DEVICE, AND IMAGING DEVICE

(71) Applicant: PANASONIC CORPORATION, Osaka (JP)

(72) Inventors: Shinzo Koyama, Osaka (JP); Takahiko Murata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 153 days.

(21) Appl. No.: 14/139,587

(22) Filed: Dec. 23, 2013

(65) Prior Publication Data
US 2014/0111676 A1    Apr. 24, 2014

Related U.S. Application Data

(63) Continuation of application No. PCT/JP2012/004133, filed on Jun. 26, 2012.

(30) Foreign Application Priority Data

Jul. 1, 2011   (JP) .................................. 2011-147703

(51) Int. Cl.
*H04N 3/14*       (2006.01)
*H04N 5/3745*     (2011.01)
(Continued)

(52) U.S. Cl.
CPC ......... *H04N 5/37452* (2013.01); *H04N 5/365* (2013.01); *H04N 5/378* (2013.01);
(Continued)

(58) Field of Classification Search
CPC ............. H01L 27/146; H01L 27/14609; H01L 27/14641
(Continued)

(56) References Cited

U.S. PATENT DOCUMENTS

| | | | |
|---|---|---|---|
| 6,573,936 B2 * | 6/2003 | Morris .................. | H04N 5/335 348/294 |
| 6,734,906 B1 | 5/2004 | Hashimoto | |

(Continued)

FOREIGN PATENT DOCUMENTS

| | | | | |
|---|---|---|---|---|
| JP | 2000-078474 A | 3/2000 | | |
| JP | 2005-354484 | * 12/2005 | ............. | H04N 5/335 |

(Continued)

OTHER PUBLICATIONS

International Search Report issued in International Application No. PCT/JP2012/004133 with Date of mailing Aug. 7, 2012, with English Translation.

*Primary Examiner* — Ngoc-Yen Vu
(74) *Attorney, Agent, or Firm* — McDermott Will & Emery LLP

(57) ABSTRACT

A solid-state imaging device includes: a pixel unit in which a plurality of unit pixels is arranged in rows and columns, the unit pixels performing photoelectric conversion of incident light to generate pixel information; and a secondary memory unit in which a plurality of unit memories is arranged in rows and columns, the unit memories holding the pixel information, wherein each of the columns in the secondary memory unit includes, as a unit memory block, the unit memories in the column, the secondary memory unit includes: a memory signal line provided for each of the columns in the memory unit; and a selection transistor provided between the unit memory block and the memory signal line, and shared by the plurality of unit memories in the unit memory block.

18 Claims, 10 Drawing Sheets

(51) Int. Cl.
*H04N 5/374* (2011.01)
*H04N 5/378* (2011.01)
*H04N 5/365* (2011.01)
H04N 5/335 (2011.01)
H01L 27/146 (2006.01)

(52) U.S. Cl.
CPC ..... *H04N 5/3741* (2013.01); *H01L 27/14609* (2013.01); *H01L 27/14641* (2013.01)

(58) Field of Classification Search
USPC .......................................... 348/302, 308–310
See application file for complete search history.

(56) References Cited

U.S. PATENT DOCUMENTS

| | | | |
|---|---|---|---|
| 6,903,772 B1 * | 6/2005 | Shinohara | H04N 3/155 348/302 |
| 7,218,347 B2 * | 5/2007 | Shinohara | H01L 27/14645 257/E27.134 |
| 7,488,928 B2 * | 2/2009 | Krymski | H04N 3/155 250/208.1 |
| 7,570,293 B2 * | 8/2009 | Nakamura | H04N 5/335 341/126 |
| 7,639,296 B2 * | 12/2009 | Mabuchi | H04N 3/155 348/294 |
| 8,363,133 B2 | 1/2013 | Hara | |
| 8,405,179 B2 * | 3/2013 | Narui | H01L 27/14614 257/432 |
| 8,638,378 B2 * | 1/2014 | Sugiyama | G01S 11/12 348/272 |
| 2005/0206757 A1 * | 9/2005 | Itoh | H04N 3/1512 348/294 |
| 2008/0068471 A1 | 3/2008 | Kondo et al. | |
| 2008/0117661 A1 * | 5/2008 | Holtzclaw | H01L 27/112 365/96 |
| 2009/0051801 A1 | 2/2009 | Mishina et al. | |
| 2010/0013973 A1 * | 1/2010 | Adkisson | H04N 5/37452 348/308 |
| 2010/0271523 A1 | 10/2010 | Hara | |
| 2011/0085066 A1 * | 4/2011 | Sugawa | H04N 5/37452 348/302 |

FOREIGN PATENT DOCUMENTS

| | | |
|---|---|---|
| JP | 2005-354484 A | 12/2005 |
| JP | 2007-318812 A | 12/2007 |
| JP | 2008-072188 A | 3/2008 |
| JP | 2009-049740 A | 3/2009 |
| JP | 2009-159335 A | 7/2009 |

* cited by examiner

SOLID-STATE IMAGING DEVICE, METHOD FOR DRIVING SOLID-STATE IMAGING DEVICE, AND IMAGING DEVICE

CROSS REFERENCE TO RELATED APPLICATION

This is a continuation application of PCT International Application No. PCT/JP2012/004133 filed on Jun. 26, 2012, designating the United States of America, which is based on and claims priority of Japanese Patent Application No. 2011-147703 filed on Jul. 1, 2011. The entire disclosures of the above-identified applications, including the specifications, drawings and claims are incorporated herein by reference in their entirety.

FIELD

The present disclosure relates to a solid-state imaging device including memories, and particularly to a technique for dividing the memories in column direction, that is, placing of multiple blocks for column memories of the solid-state imaging device.

BACKGROUND

Conventionally, Patent Literature (PTL) 1 has been disclosed as a technique for temporarily storing pixel information in a memory and outputting the pixel information. The solid-state imaging device disclosed in PTL 1 is shown in FIG. 10.

This solid-state imaging device includes a pixel unit 2, a vertical scanning unit (not shown), a noise suppression unit 31 which suppresses noise of a pixel signal from a selected row of a unit pixel cell 1, a memory unit 22 which has a memory cell 21 and accumulates output signals from the noise suppression unit 31, a memory vertical scanning unit (not shown), a horizontal selection unit 5, a horizontal signal line 11, and an output amplifier 12.

CITATION LIST

Patent Literature

[PTL1] Japanese Unexamined Patent Application Publication No. 2008-072188

SUMMARY

Technical Problem

However, with the solid-state imaging device including memories according to the conventional technique, horizontal stripe trouble called streak occurs when storing the pixel information into the memory unit 22 at a higher speed. FIG. 3B shows an image with streak.

One non-limiting and exemplary embodiment provides a solid-state imaging device, a method for driving the solid-state imaging device, and an imaging device which are capable of suppressing the horizontal stripe noise etc.

Solution to Problem

In order to solve the above-described problems, a solid-state imaging device according to an aspect of the present disclosure includes: a pixel unit in which a plurality of unit pixels is arranged in rows and columns, the unit pixels performing photoelectric conversion of incident light to generate pixel information; and a memory unit in which a plurality of unit memories is arranged in rows and columns, the unit memories holding the pixel information, wherein each of the columns in the memory unit includes, as a unit memory block, the unit memories in the column, the memory unit includes: a memory signal line provided for each of the columns in the memory unit; and a selection switch provided between the unit memory block and the memory signal line, and shared by the plurality of unit memories in the unit memory block, and each of the unit memories includes a write transistor, a capacitor, and a read transistor.

Advantageous Effects

The solid-state imaging device, the method for driving the solid-state imaging device, and the imaging device according to one or more exemplary embodiments or features disclosed herein make it possible to reduce the parasitic capacitance of the memory signal line or the pixel signal line by adopting a block configuration for the column memory or the unit pixel group in the same column. Reducing the capacitance allows reducing the current consumed by the driving circuit when writing the signals into the memory or reading the signals to the pixel signal line, thereby reducing the effect of voltage drop caused by impedance component of a power line for supplying electricity to the driving circuit. Reducing the voltage drop of the power line allows suppressing the horizontal stripe noise when capturing a high-intensity object. Furthermore, a high-speed signal transfer to the pixel signal line or the memory can be realized.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
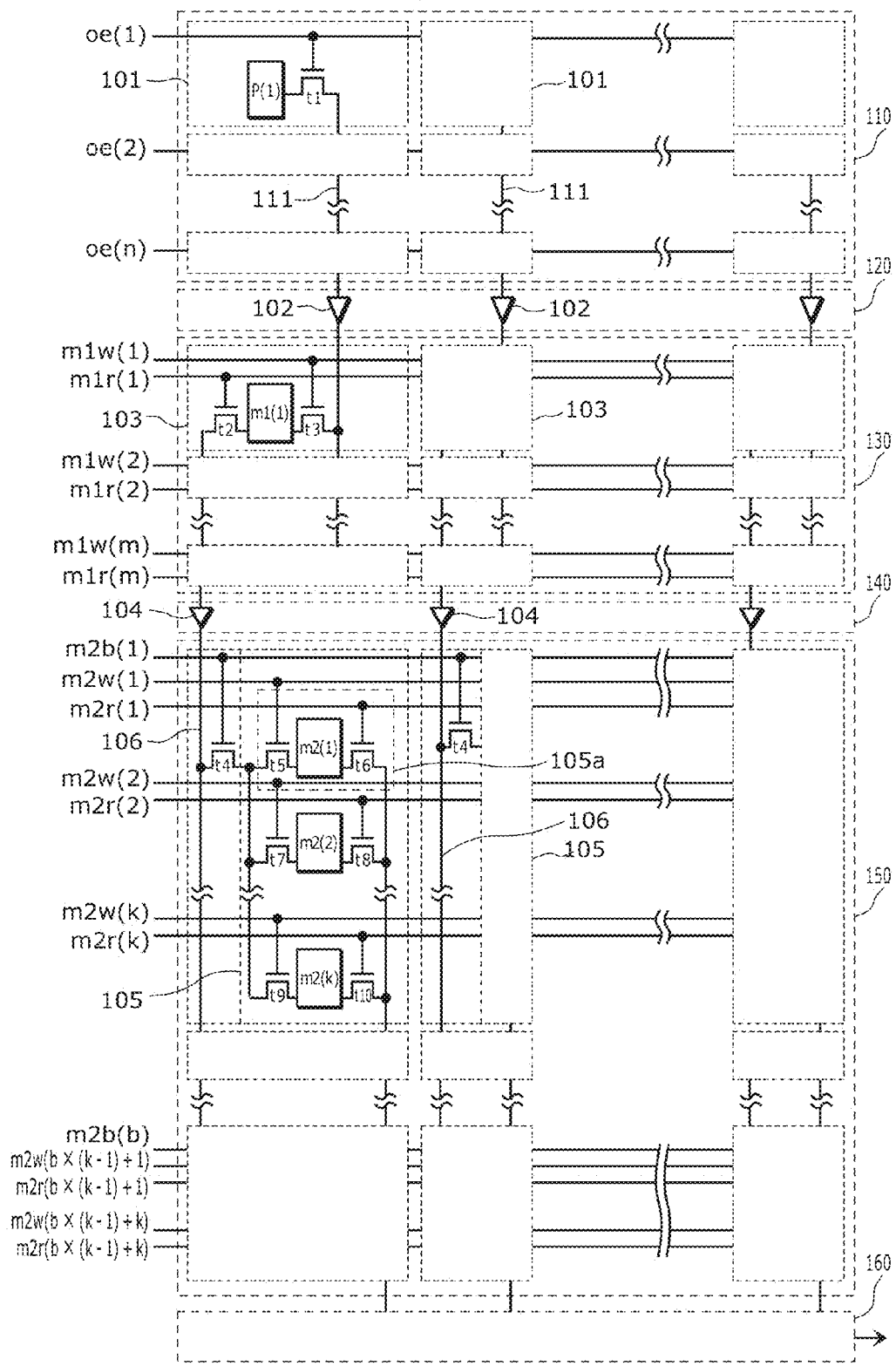
FIG. 1 shows a schematic diagram of a configuration of a solid-state imaging device according to Embodiment 1.

[Underlying Knowledge Forming Basis of the Present Disclosure]

The inventors have found that the following problems are caused in the solid-state imaging device recited in "Background" section. When a high-intensity object is present, the columns in the unit pixel cell 1 where a lot of current is flowing increase in number, which makes the power source voltage supplied to each of the columns of the unit pixel cell 1 different. The streak described above is a horizontal stripe trouble caused by the difference.

The streak occurs because the current, which is consumed by the amplifier A15 for charging and discharging the total capacitance including diffusion capacitance etc. of the memory write transistor M31 of an unselected memory cell 21 connected to a signal line of the memory unit 22, increases when capturing the high-intensity object, which causes a voltage drop in a power line for supplying electricity to the amplifier A15.

A solid-state imaging device according to an aspect of the present disclosure includes: a pixel unit in which a plurality of unit pixels is arranged in rows and columns, the unit pixels performing photoelectric conversion of incident light to generate pixel information; and a memory unit in which a plurality of unit memories is arranged in rows and columns, the unit memories holding the pixel information, wherein each of the columns in the memory unit includes, as a unit memory block, the unit memories in the column, the memory unit includes: a memory signal line; and a selection switch disposed between the unit memory block and the memory signal line, and shared by the plurality of unit memories in the unit memory block, and each of the unit memories includes a write transistor, a capacitor, and a read transistor.

Specifically, by adopting a block configuration for column memories (unit memories) in the column), the number of switches to be connected to the memory signal line connected to the unit memories can be reduced significantly. Therefore, it is possible to reduce the total capacitance caused by the diffusion capacitance of a switch which is unselected and connected to the memory signal line. Reducing the capacitance allows reducing the current consumed by the driving circuit when writing the signals into the unit memory (when driving the memory signal line), thereby reducing the effect of voltage drop caused by impedance component of a power line for supplying electricity to the driving circuit.

Reducing the voltage drop of the power line allows suppressing the horizontal stripe noise etc. when capturing a high-intensity object. Furthermore, signals can be transferred to the unit memory at a higher speed.

Here, the memory signal line may be shared by a plurality of columns of the unit memories.

Specifically, by sharing the memory signal line by the unit memories of a plurality of columns, compact memory layout is realized. Since the area of the memory unit can be reduced, the cost per chip can be reduced.

Furthermore, the solid-state imaging device may further include a signal driving unit configured to write the pixel information into the memory unit, wherein the signal driving unit may be shared by a plurality of columns of the unit memories.

Specifically, by sharing the signal driving unit by the unit memories of a plurality of columns, compact signal driving unit layout can be realized. Since the area of the signal driving unit can be reduced, the cost per chip can be reduced.

Furthermore, the solid-state imaging device according to an aspect of the present disclosure includes: a pixel unit in which a plurality of unit pixels is arranged in rows and columns, the unit pixels performing photoelectric conversion of incident light to generate pixel information; and a memory unit in which a plurality of unit memories is arranged in rows and columns, the unit memories holding the pixel information, wherein each of the columns of the unit pixels includes the plurality of unit pixels in the column as a unit pixel block, the pixel unit includes: a pixel signal line disposed in each of the columns of the unit pixels; and a selection switch disposed between the unit pixel block and the pixel signal line, and shared by the plurality of unit pixels in the unit pixel block, and each of the unit memories includes a write transistor, a capacitor, and a read transistor.

Specifically, by adopting a block configuration for unit pixel groups in the same column, the number of switches to be connected to the pixel signal line connected to the unit pixels can be reduced significantly.

Therefore, it is possible to reduce the sum of parasitic capacitance caused by the diffusion capacitance of a switch which is unselected and connected to the pixel signal line. Reducing the capacitance allows reducing the current consumed by the driving circuit when reading the signals into the pixel signal line (when driving the pixel signal line), thereby reducing the effect of voltage drop caused by impedance component of a power line for supplying electricity to the driving circuit.

Reducing the voltage drop of the power line allows suppressing the horizontal stripe noise etc. when capturing a high-intensity object. Furthermore, signals can be transferred to the pixel signal line at high speed.

Furthermore, each of the unit pixels may include: a photoelectric conversion element which performs photoelectric conversion of the incident light to generate signal charges; an amplifying transistor which outputs a signal voltage corresponding to an amount of the signal charges as the pixel information; and a row selection transistor which causes the signal voltage to be output to the pixel signal line.

Furthermore, a method for driving a solid-state imaging device according to an aspect of the present disclosure is a method for driving a solid-state imaging device, the solid-state imaging device including: a pixel unit in which a plurality of unit pixels is arranged in rows and columns, the unit pixels performing photoelectric conversion of incident light to generate pixel information; and a memory unit in which a plurality of unit memories is arranged in rows and columns, the unit memories holding the pixel information, each of the columns in the memory unit including, as a unit memory block, the unit memories in the column, the memory unit including: a memory signal line provided for each of the columns in the memory unit; and a selection switch provided between the unit memory block and the memory signal line, and shared by the plurality of unit memories in the unit memory block, and the memory signal line being shared by a plurality of columns of the unit memories, the method for driving the solid-state imaging device including turning ON different selection switches provided between the memory signal line and the unit memory block in a different column sharing the memory signal line, at different timing. Specifically, scanning the selection switches for each of the columns in different memory units allows unit memories of different columns to share the memory signal line.

Furthermore, the solid-state imaging device may further include a signal driving unit configured to write the pixel information into the memory unit, the signal driving unit being shared by a plurality of columns of the unit memories and a plurality of columns of the unit pixels, the method for driving the solid-state imaging device further including selectively inputting, to the signal driving unit, the pixel information of each of the unit pixels in different columns at different timing.

Specifically, by selectively inputting the signals of the unit pixels of different columns to the signal driving unit, the signal driving unit can be shared by unit pixels of different columns.

Furthermore, a driving frequency for driving the signal driving unit may be a multiplication of a fundamental frequency for reading the pixel information from the pixel unit to the signal driving unit.

Specifically, by setting the frequency for writing the signals into the unit memory to a multiplication of a fundamental frequency for reading the signals from the unit pixel, the reading of the signals and the writing of the signals into the memory can be performed without delay even when the memory signal line is shared by each of the different columns in the memory unit.

Accordingly, timing is not lost even when the area of the memory unit is reduced.

Furthermore, an imaging device according to an aspect of the present disclosure may have a feature of including the solid-state imaging device. Specifically, the use of the above-described solid-state imaging device for an imaging device makes it possible to realize an imaging device capable of operating in a manner highly close to the global shutter operation and reducing deterioration in image quality.

It is to be noted that a general or specific aspects of the above may be realized by a system, a method, an integrated circuit, a computer program, or a recording medium, and an arbitrary combination of a system, a method, an integrated circuit, a computer program, or a recording medium.

The following describes further details of the solid-state imaging device according to embodiments with reference to the Drawings. It is to be noted that the present disclosure is described with reference to the following embodiments and the accompanying Drawings, which are for illustrative purposes only, and therefore the present disclosure is not limited to these embodiments. Specifically, the constituent elements, the arrangement and connection of the constituent elements, timing, the order of timing etc. shown in the following embodiments are mere examples, and thus do not limit the present disclosure. Out of the constituents in the following embodiments, the constituents not stated in the independent claims describing the broadest concept of the present disclosure are described as optional constituents. Furthermore, in the Drawings, the elements representing substantially the same structure, operation and effect are given the same reference numerals.

Embodiment 1

FIG. 1 shows a schematic diagram of a configuration of a solid-state imaging device according to the present embodiment. FIG. 1 shows a detailed configuration of a signal path from a predetermined unit pixel 101. This configuration is also applied to signal paths from other unit pixels 101 in different columns. Accordingly, description is provided with focusing on the configuration of the signal path from the predetermined unit pixel 101.

The solid-state imaging device includes: a pixel unit 110 in which a plurality of unit pixels (unit pixel cells) 101 is arranged two-dimensionally (in rows and columns), the unit pixels 101 performing photoelectric conversion of incident light to generate pixel information; and a secondary memory unit 150 in which a plurality of unit memories 105a is arranged in rows and columns, the unit memories 105a holding the pixel information (pixel signal), wherein each of the columns in the secondary memory unit 150 includes, as a unit memory block, the unit memories 105a in the column, the secondary memory unit 150 includes: a memory signal line 106 provided for each of the columns in the secondary memory unit 150; and a selection transistor (selection switch) t4 provided between the unit memory block 105 and the memory signal line 106, and shared by the plurality of unit memories 105a in the unit memory block 105.

Hereinafter, the solid-state imaging device in FIG. 1 is described in detail.

The solid-state imaging device includes: a pixel unit 110 in which unit pixels 101 are arranged in rows and columns; a first amplifier unit 120 in which a plurality of amplifier elements (amplifier circuits) 102 are arranged for each of the columns of the unit pixels 101, a primary memory unit 130 which is a memory array; a secondary amplifier unit 140 in which amplifier elements 104 are arranged for each of the columns of the unit pixels 101, a secondary memory unit 150 which is a memory array, and an output circuit group 160.

The output circuit group 160 includes, for the case of an analog output sensor for example, a correlation double sampling (CDS) circuit, a horizontal shift register, an output amplifier, and so on. For the case of a digital output sensor, the output circuit group 160 further includes an analog/digital conversion (ADC) circuit arranged for each of the columns of the unit pixels 101, each of a plurality of the columns of the unit pixels 101, or each of a predetermined number of outputs. It is to be noted that the output signals from the output circuit group 160 may be converted and output by a high-speed output interface circuit such as a low voltage differential signal (LVDS) circuit.

The pixel unit 110 includes unit pixels 101, each provided with a photoelectric conversion element, arranged in rows and columns. It is to be noted that the photoelectric conversion element may be in any form. Specifically, the photoelectric conversion element may include either of a photodiode or a photoelectric conversion film. Furthermore, the unit pixel 101 may be in a multi-pixel one-cell structure including a plurality of photoelectric conversion elements. The unit pixel 101 may be, in a driving circuit substrate on which photoelectric conversion elements and transistors are formed, (i) a front-side irradiation sensor formed with an optical system such as a lens on a front side, on which the wire etc. is formed, of the driving circuit substrate and receives light from the front side or (ii) a back-side irradiation sensor formed with an optical system such as a lens on a back side of the driving circuit substrate and receives light from the back side. Furthermore, the unit pixel 101 may be a multilayer sensor formed with a photoelectric conversion film on the surface of the driving circuit substrate and receives light at the photoelectric conversion film and generates signal charges.

The unit pixel 101 includes: a photoelectric conversion element which performs photoelectric conversion of the incident light to generate signal charges; a photoelectric conversion unit P(1) including an amplifying transistor which outputs a signal voltage corresponding to an amount of the signal charges as pixel information; a row selection transistor t1; and a pixel signal line (vertical signal line) 111 provided for a column of the unit pixels 101. One of the source and the drain of the amplifying transistor is connected to a power line common to all of the unit pixels 101. The row selection transistor t1 is provided between (i) the other one of the source and the drain of the amplifying transistor and (ii) the pixel signal line 111, and causes the pixel signal line 111 to output the pixel information. The pixel signal line 111 is connected to a constant-current source (not shown) for reading the pixel information of the unit pixels 101 to the pixel signal line 111.

It is to be noted that the photoelectric conversion unit P(1) may further include: a floating diffusion (FD) unit which accumulates the signal charges of the photoelectric conversion element and is connected to the gate of the amplifying transistor; and a reset transistor having one of the source and the drain connected to the FD unit and the other one of the source and the drain connected to a reset voltage common to all of the unit pixels 101.

The primary memory unit 130 includes unit memories 103 which are arranged in rows and columns, and is significantly less in number than the unit pixels 101 of the pixel unit 110. The same number of unit memories 103 are provided for each of the columns of the unit pixels 101. The unit memory 103 includes: a write transistor t3 as a switch connected to the pixel signal line 111 via the amplifier element 102; a capacitor m1(1) which holds the pixel information of the pixel signal line 111 written by the write transistor t3; and a read transistor t2 which reads the pixel information held in the capacitor m1(1).

The primary amplifier unit 120 is a driving circuit for writing the input signals (pixel information from the pixel unit 110) to a subsequent primary memory unit 130. The secondary amplifier unit 140 is a driving circuit for writing the input signals (pixel information held in the primary memory unit 130) to a subsequent secondary memory unit 150. Although the primary amplifier unit 120 and the secondary amplifier unit 140 include a direct current cut capacitor, a bias application circuit, and a source follower circuit for example, the CDS circuit etc. may also be included. The primary amplifier unit 120 includes amplifier elements 102 provided for each of the columns of the unit pixels 101. Likewise, the secondary amplifier unit 140 includes amplifier elements 104 provided for each of the columns of the unit pixels 101.

Next, the configuration of the secondary memory unit 150 is described in detail.

The secondary memory unit 150 includes a plurality of unit memory blocks 105, which are small memory groups, arranged in rows and columns. The unit memory block 105 includes unit memories 105a in the same column, and is provided in plural number corresponding to a column of the unit pixels 101. Each of the columns of the unit memory 105a corresponds to a column of the unit pixels 101, and holds the signals of the corresponding unit pixels 101. It is to be noted that the number of rows of the unit memories 105a may be greater than or equal to the number of rows of the unit pixels 101. For example, both of the rows may be in the same number, and the pixel information of each of the unit pixels 101 may be held in different unit memories 105a in the same time period.

The secondary memory unit 150 includes a memory signal line 106 connected to the amplifier element 104, and a selection transistor t4 provided between the memory signal line 106 and the unit memory block 105. The selection transistor t4 is provided individually for each of the plurality of unit memory blocks 105.

The unit memory 105a includes: a write transistor t5 which is connected to the memory signal line 106 via the selection transistor t4; a capacitor m2(1) which holds the pixel information (signal voltage of the memory signal line 106) written by the write transistor t5; and a read transistor t2 which reads the pixel information held in the capacitor 112. It is to be noted that other unit memories 105a have the same configuration as above. For example, another unit memory 105a includes a write transistor t7, a capacitor m2(2), and a read transistor t8. Furthermore, a yet another unit memory 105a includes a write transistor t9, a capacitor m2(k), and a read transistor t10.

In this secondary memory unit 150, the memory signal line 106 and the unit memory block 105 become conductive or non-conductive when the selection transistor t4 is turned ON or OFF, respectively. Then, for example, when the write transistor t5 is turned ON while the selection transistor t4 is ON, the signal voltage of the memory signal line 106 is stored in the capacitor m2(1). By selectively turning ON the write transistors t5, t7, and t9 in this manner, a capacitor for storing the pixel information in the unit memory block 105 is selected. A different unit memory block 105 connected to the same memory signal line 106 can be operated in the same manner.

A method for driving the solid-state imaging device according to the present embodiment is described with reference to FIG. 2.

Figure 2:
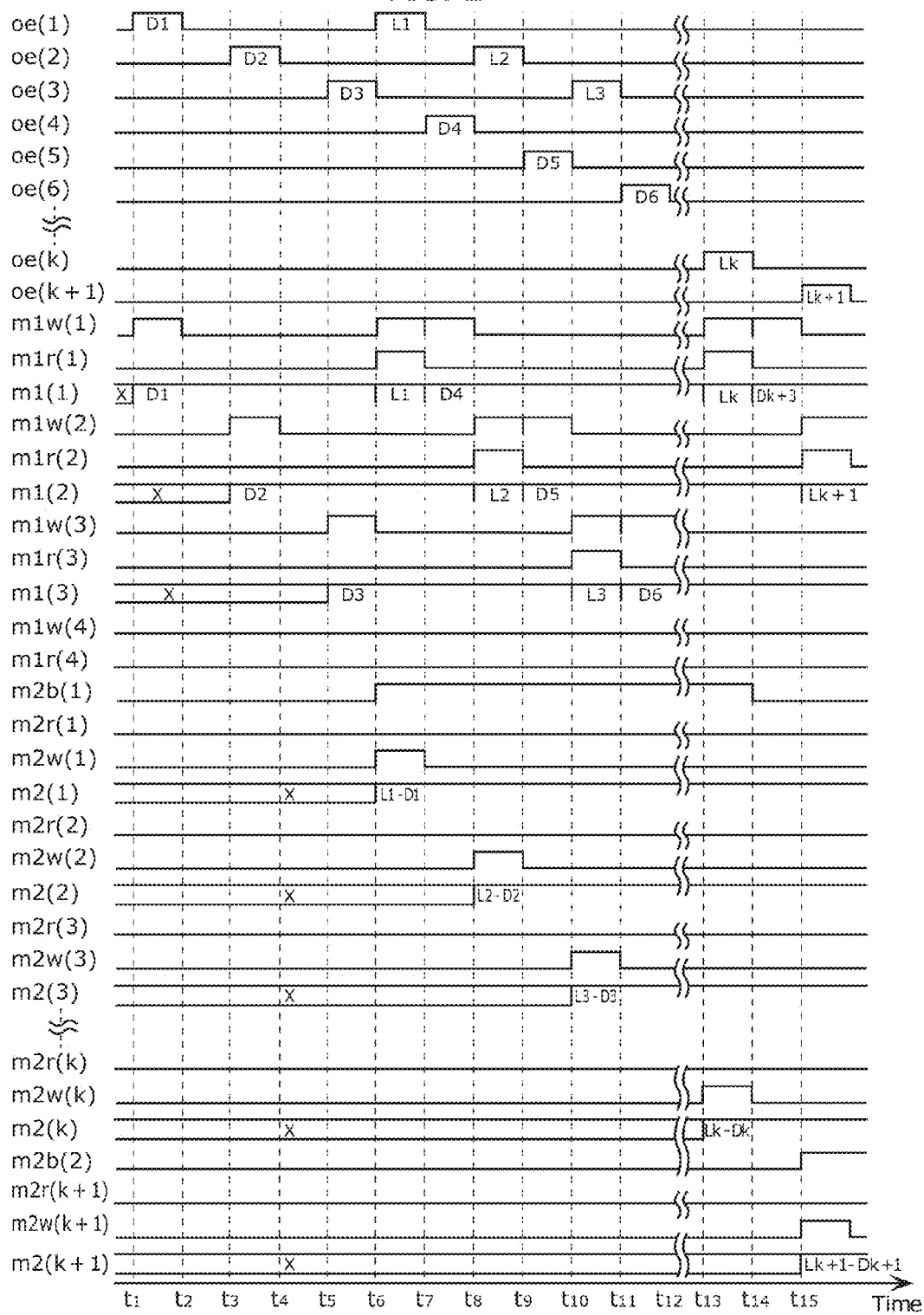
FIG. 2 shows a timing chart showing a method for driving the solid-state imaging device according to Embodiment 1.

FIG. 2 shows a timing chart showing the method for driving the solid-state imaging device.

In FIG. 2, oe(a) (a is an integer) is a control signal for turning ON/OFF the output from the unit pixels 101 (for controlling ON/OFF of the row selection transistor t1).

m1w(b) (b is an integer) is a control signal for controlling writing to the capacitor m1(b) of the primary memory unit 130 (for controlling ON/OFF of the write transistor t3). m1r(c) (c is an integer) is a control signal for controlling reading from the capacitor m1(c) of the primary memory unit 130 (for controlling ON/OFF of the read transistor t2). For example, Dk (k is an integer) represents a reset signal of the unit pixel 101 (signal voltage of the unit pixel 101 at the time of resetting), and Lk represents a light signal of the unit pixel 101 (signal voltage corresponding to signal charges generated by the unit pixel 101 through photoelectric conversion). X represents undefined data.

m2b(e) (e is an integer) is a block control signal for controlling the conduction of the memory signal line 106 and the unit memory block 105 of the secondary memory unit 150 (for controlling ON/OFF of the selection transistor t4). m2r(f) (f is an integer) is a control signal for selecting a capacitor from which the data, which is held in the capacitor m2(f) of the secondary memory unit 150, is read when reading the data (for controlling ON/OFF of the read transistors t6, t8, and t10). m2w (g) (g is an integer) is a control signal for selecting a capacitor to which data is written into the capacitor m2(f) of the secondary memory unit 150 when writing data (for controlling ON/OFF of the write transistors t5, t7, and t9). As an example of the data held in the capacitor m2(h), L1–D1 represents a signal obtained by subtracting the reset signal from the light signal of the unit pixel 101.

First, by setting the control signal oe(1) to a high level at Time t1 and turning ON the selection transistor t1, the reset signal D1 of the unit pixel 101 is supplied to the pixel signal line 111 of the pixel unit 110. At the same time, at Time t1, the reset signal D1 is written into the primary memory unit 130 by the primary amplifier unit 120.

Specifically, by setting the control signal m1w(1) to the high level and turning ON the write transistor t3, D1 data is written into the capacitor m1(1) of the primary memory unit 130. After that, the light signal Lk and the reset signal Dk are read, from each of the unit pixels 101, alternately in the sequence shown in FIG. 2.

Next, by setting the control signals m2b(1) and m2w(1) to a high level at Time t6 and turning ON the selection transistor t4 and the write transistor t5, the pixel information of the unit pixels 101 in the capacitor m1(1) of the primary memory unit 130 is written into the capacitor m2(1) of the secondary memory unit 150.

At this time, for example when a CDS circuit is included in the secondary amplifier unit 140 as an example of a circuit design, the data stored in the secondary memory unit 150 is a signal obtained by subtracting the reset signal D1 from the light signal L1. This is indicated by the fact that the data of L1–D1 is stored in the capacitor m2(1) at Time t6.

By turning ON the block control signal m2b(1) at Time t6, writing to the capacitor m2(1) is succeeded. It is to be noted that the selection transistor t4 between the unselected unit memory block 105 and the memory signal line 106 are turned OFF at this time.

Since the selection transistor t4 between the unselected unit memory block 105 and the memory signal line 106 is OFF, the number of the unselected (OFF-state) transistors connected to the memory signal line 106 that is a signal line common to the secondary memory unit 150 is obtained by M+k−1, which is a sum of: (k−1) which represents the number of the unselected (OFF-state) write transistors in the selected unit memory block 105 (k represents a total number of the write transistors in the unit memory block 105); and M which represents the number of unit memory blocks 105.

At this time, in the case where the secondary memory unit 150 is not divided into a plurality of blocks, (M×k+k−1) unselected transistors are connected to the memory signal line 106. Since junction capacitance of the unselected transistors, coupling capacitance between the gate electrode and the drain portion, and so on, are connected in parallel for the transistors connected to the memory signal line 106, the amplifier element 104 is required to charge and discharge the whole parasitic capacitance.

Figure 3A:
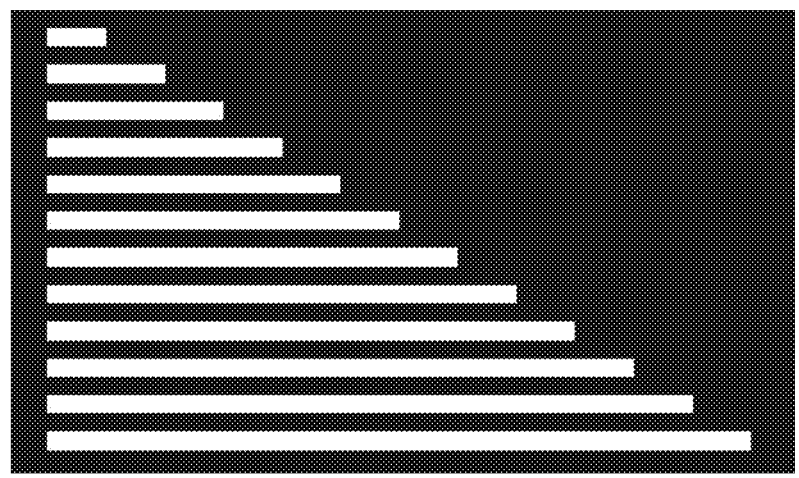
FIG. 3A shows a high-intensity object.
Figure 3B:
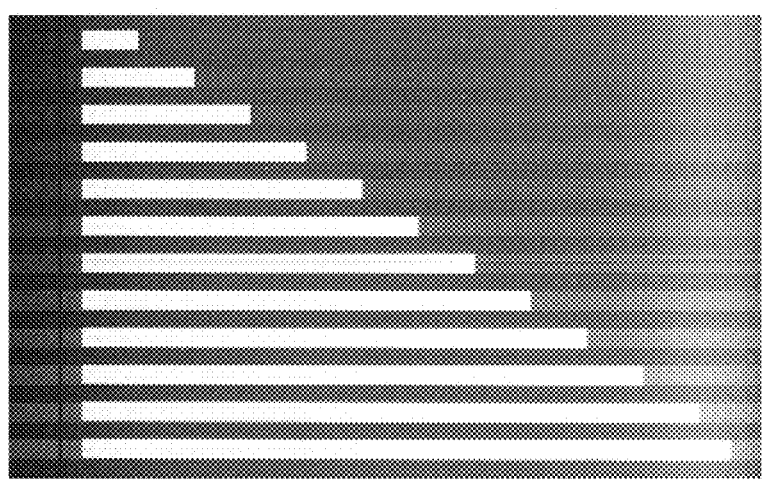
FIG. 3B shows an image of the high-intensity object with horizontal stripe noise.

Needles to say, this charge-and-discharge depends on the signals. For example, when a lot of signals having large contrast differences are present in a horizontal direction, a large amount of current flow is required at the amplifier element 104, which causes voltage drop due to the impedance component of the power line connected to the amplifier element 104 and causes horizontal-stripe noise in the image data. This is shown in FIG. 3B, for example. FIG. 3B shows an image obtained by capturing the high-intensity object in FIG. 3A, resulting in horizontal pull noise.

However, by reducing the parasitic capacitance connected to the memory signal line 106 of the secondary memory unit 150 by dividing the secondary memory unit 150 into a plurality of blocks, the amount of charges charged and discharged by the amplifier element 104 is reduced. As a result, the voltage drop in the power line for supplying electricity to the amplifier element 104 can be reduced.

By writing all of the data (pixel information of all of the unit pixels 101) continuously to the secondary memory unit 150 in the same manner through the above operation, writing to the secondary memory unit 150 can be performed at a higher speed, and the image without the horizontal pulling noise can be obtained on the secondary memory unit 150.

Next, the data of the secondary memory unit 150 is read and output. The data written into the secondary memory unit 150 is output via the output circuit group 160. At this time, with a solid-state imaging device of analog output, the output circuit group 160 includes a CDS circuit, a horizontal shift register, a source follower output circuit, and so on, and outputs the frame data in a predetermined cycle such as 60 fps, for example. In contrast, with a solid-state imaging device of digital output, the output circuit group 160 includes CDS, ADC, and LVDS circuits, and outputs digital data.

As described above, with the solid-state imaging device according to the present embodiment, the secondary memory unit 150 includes a plurality of unit memory blocks 105, and the unit memory block 105 is connected to the memory signal line 106 via the selection transistor t4 provided corresponding to each of the unit memory blocks. Accordingly, the parasitic capacitance of the memory signal line 106 can be reduced which allows writing of pixel information to the secondary memory unit 150 at a higher speed and reducing the horizontal-stripe noise etc.

It is to be noted that the solid-state imaging device in the present embodiment may be designed to also include a signal processing circuit and so on. Furthermore, the configuration of the capacitor included in the primary memory unit 130 and the secondary memory unit 150 is not limited as long as it is a capacitor type memory element for holding voltages.

Figure 4:
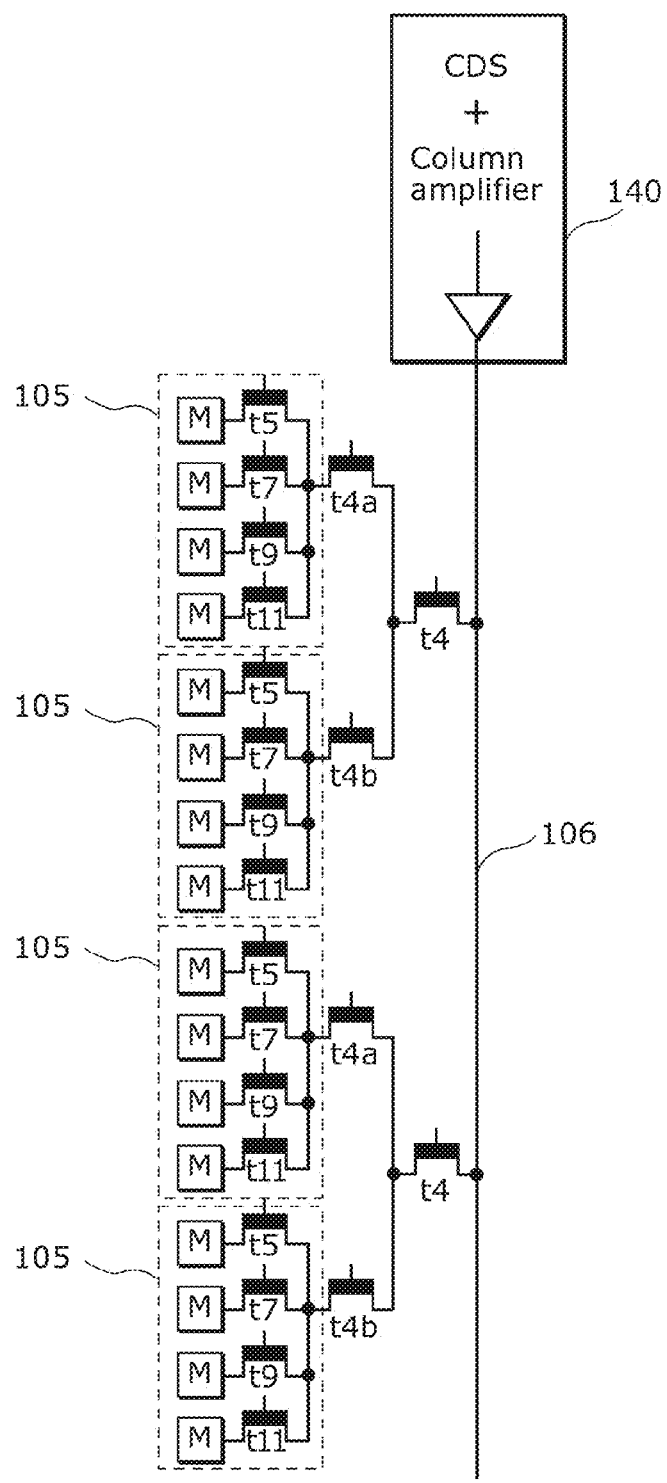
FIG. 4 shows a configuration of a modification of a secondary memory unit of the solid-state imaging device according to Embodiment 1.

Furthermore, in the present embodiment, the block configuration of the secondary memory unit 150 of the solid-state imaging device is not limited to a single-stage configuration but may be multiple-stage configuration. For example, the secondary memory unit 150 may be of two-stage configuration as shown in FIG. 4. In this configuration, selection transistors t4a and t4b are provided between the selection transistor t4 and the read transistors t5, t7, t9, and t11.

Furthermore, although each of the columns of the unit memories 105a includes a plurality of unit memory blocks 105 in the present embodiment, it may include at most one unit memory block. Specifically, at most one selection transistor t4 may be provided for each of the columns of the unit memories 105a.

Embodiment 2

Since the block configuration is adopted for the secondary memory unit 150 in Embodiment 1, the signal line is provided in the unit memory block 105 separately from the memory signal line 106 in the secondary memory unit 150, and thus two signal lines are present corresponding to each of the columns of the unit pixels 101. Therefore, adopting the block configuration causes an increase in the unit area of the secondary memory unit 150. The configuration according to Embodiment 2 provides an advantageous effect which lessens the area problem.

Figure 5:
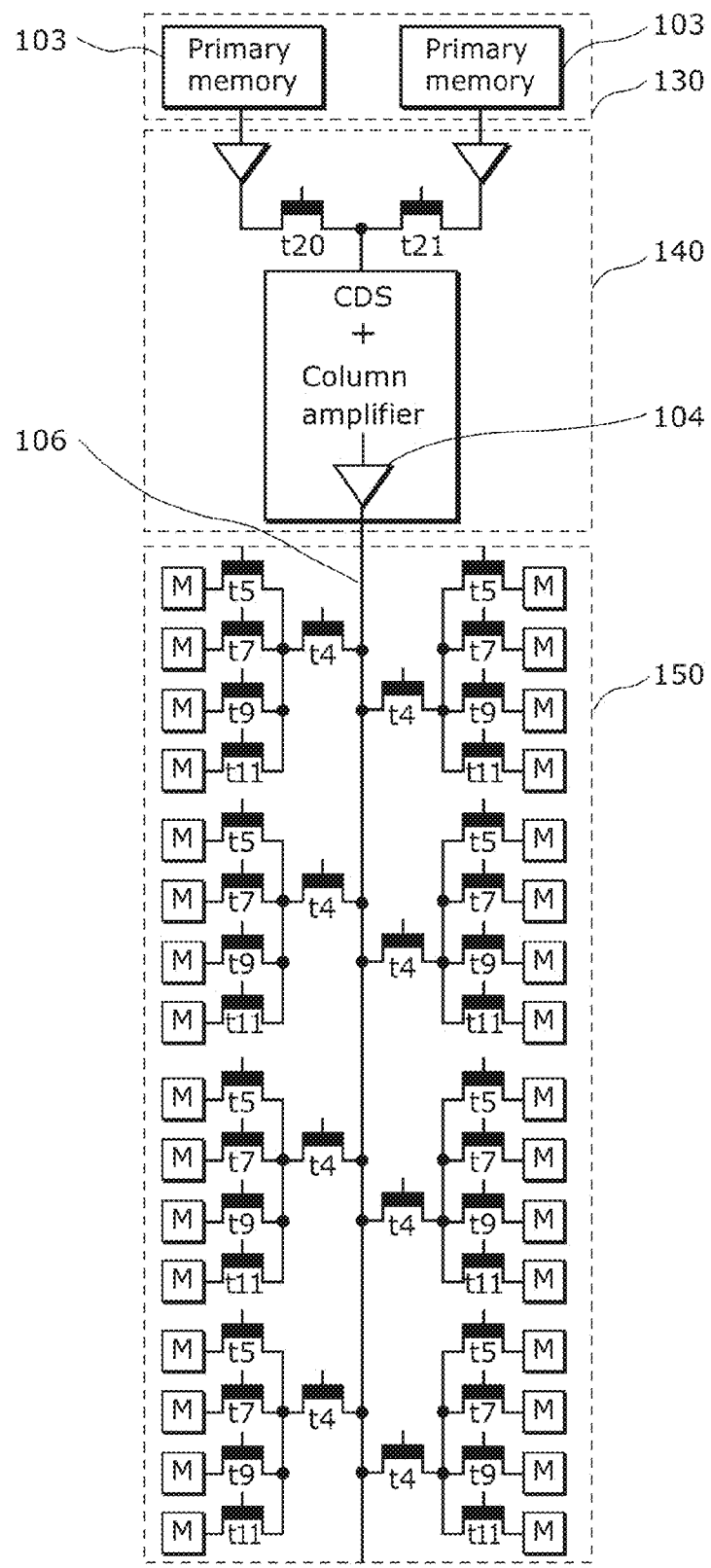
FIG. 5 shows a configuration of a secondary amplifier unit and a secondary memory unit of a solid-state imaging device according to Embodiment 2.

FIG. 5 shows a configuration of a primary memory unit 130, a secondary amplifier unit 140, and a secondary memory unit 150 according to the present embodiment. In FIG. 5, a signal path from the unit pixels 101 for two columns is representatively abstracted and described. Description is provided below with focusing on the differences from Embodiment 1.

This solid-state imaging device is different from Embodiment 1 in that a single memory signal line 106 is shared by a plurality of columns of the unit memories 105a. Another difference from Embodiment 1 is that: a signal driving unit, which includes a CDS circuit and writes pixel information into the secondary memory unit 150, is included as a secondary amplifier unit 140; and a single signal driving unit is shared by a plurality of columns of the unit memories 105a.

In this configuration, the solid-state imaging device is driven in a manner that different selection transistors t4 provided between the unit memory blocks 105 and the memory signal line 106 of different columns sharing the memory signal line 106 are turned ON at different times. Furthermore, the solid-state imaging device is driven in a manner that the pixel information of the unit pixels 101 of different columns is selectively input to the single signal driving unit at different times. Furthermore, a driving frequency for driving the signal driving unit is a multiplication of a fundamental frequency for reading the pixel information from the pixel unit 110 to the signal driving unit.

Each of the two columns of the unit memory blocks 105 is provided for a different column of the unit pixels 101. In the secondary memory unit 150, the following three signal lines are present as signal lines extending in a column direction: a memory signal line 106; a signal line in the unit memory block 105 of one of the two columns; and a signal line in the unit memory block 105 of the other one of the two columns.

Accordingly, the number of signal lines has been reduced to 1.5 lines per unit memory block 105 in one column, as compared to the configuration in FIG. 1. In the case where the area is focused as a basis for designing as in the above case, a common signal line may also be adopted. In this case, it is required to double the writing speed from the primary memory unit 130 as compared to that of the transfer speed from the unit pixels 101.

Figure 6:
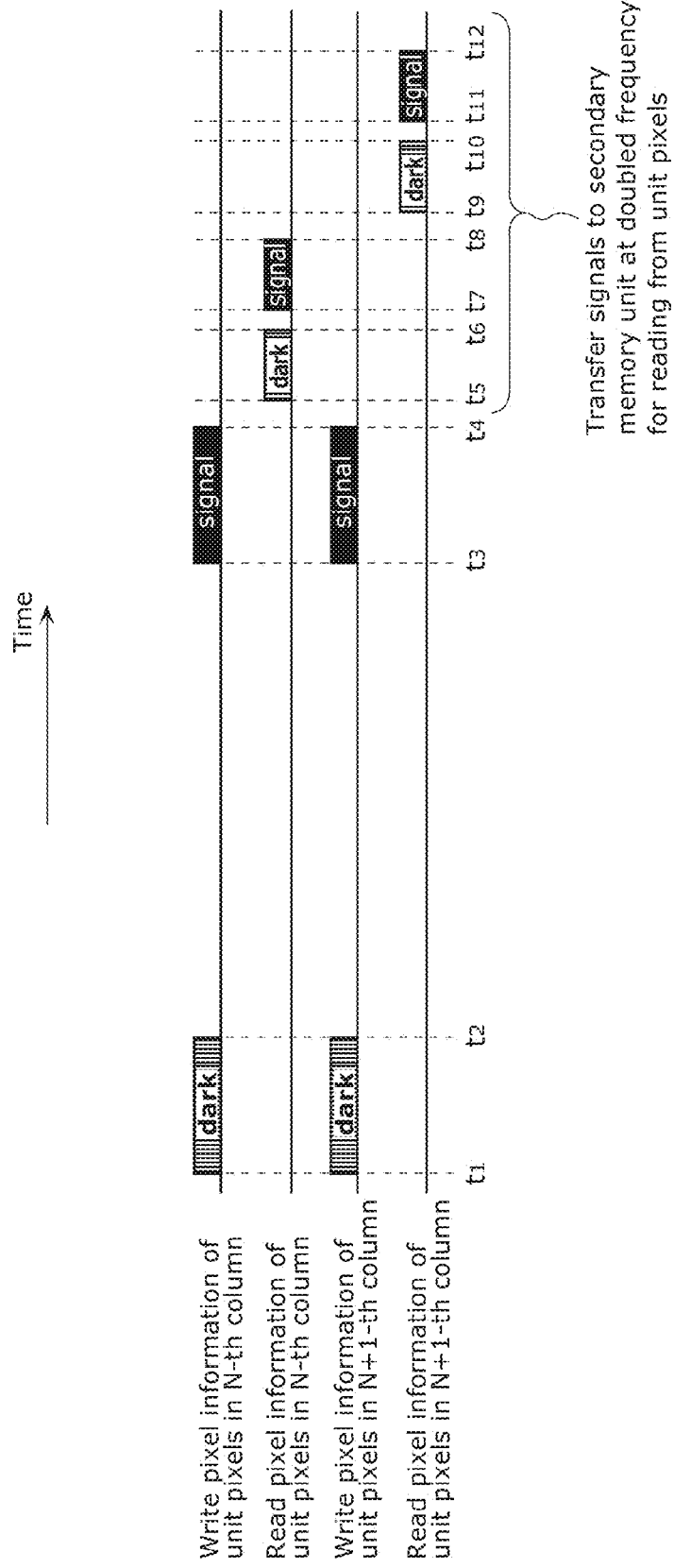
FIG. 6 shows a timing chart which shows a method for driving the solid-state imaging device according to Embodiment 2.

A simple timing chart showing the above is shown in FIG. 6. FIG. 6 shows timing of writing to the primary memory unit 130 (t1 to t4 in FIG. 6) and timing of reading from the primary memory unit 130 (t5 to t12 in FIG. 6), of the pixel information of the two columns (N-th column and N+1-th column (N is a natural number)) of the unit pixels 101, which are adjacent to each other and share the memory signal line 106. In FIG. 6, the reset signal of the unit pixel 101 is represented as "dark", and the pixel signal is represented as "signal".

The selection transistors t20 and t21 connecting the primary memory unit 130 and the CDS circuit are driven complementarily. The two selection transistors t4 each connecting the memory signal line 106 with the unit memory block 105 in the left or that in the right are driven complementarily. With this, the signal of the primary memory unit 130 can be stored in the secondary memory unit 150 using the common CDS circuit and the amplifier element 104 that is the common secondary amplifier unit 140.

As described above, with the solid-state imaging device according to the present embodiment, the memory signal line 106 is shared by a plurality of columns of the unit memory blocks 105, thereby realizing miniaturization.

Embodiment 3

Although the block configuration is adopted for the secondary memory unit 150 in Embodiment 1, the block configuration is adopted for the pixel unit 110 in the present embodiment.

Figure 7:
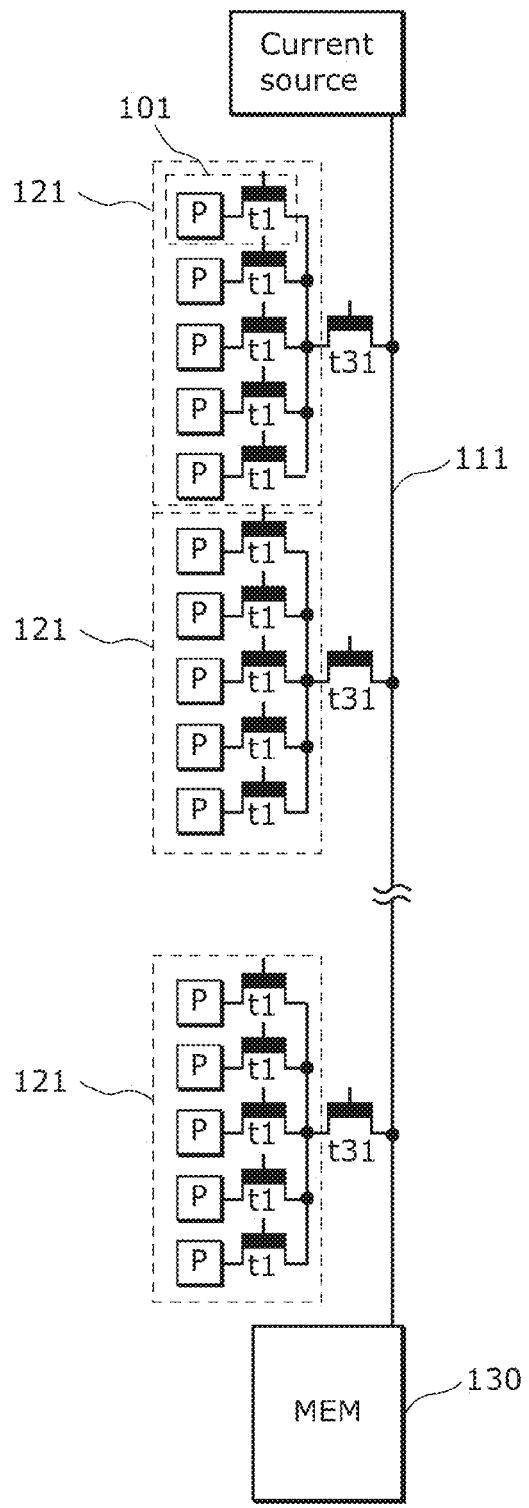
FIG. 7 shows a configuration of a pixel unit of a solid-state imaging device according to Embodiment 3.

FIG. 7 shows a configuration of a pixel unit 110 of the solid-state imaging device according to the present embodiment. In FIG. 7, unit pixels 101 in a predetermined column are representatively abstracted and described. Hereinafter, description is provided below with focusing on the differences from Embodiment 1.

This solid-state imaging device is different from Embodiment 1 in that: a column of the unit pixels 101 includes a plurality of unit pixels 101 in the column as a unit pixel block 121; a pixel unit 110 includes (i) a pixel signal line 111 provided for each of the columns of the unit pixels 101 and (ii) a selection transistor (selection switch) provided between the unit pixel block 121 and the pixel signal line 111, and shared by a plurality of unit pixels 101 in the unit pixel block 121.

The plurality of unit pixels 101 in the same column are grouped into a plurality of blocks, a selection transistor t31 is provided for each of the blocks, and the selection transistor t31 is connected to the pixel signal line 111. Furthermore, the row selection transistor t1 is provided between the corresponding photoelectric conversion unit P and the selection transistor t31. This configuration allows reducing the number of transistors connected to the pixel signal line 111. As a result, the pixel signal line 111 can be driven in a manner that the signals from the unit pixels 101 are written into the memory at a higher speed.

As described above, with the solid-state imaging device according to the present embodiment, the pixel unit 110 includes a plurality of unit pixel blocks 121, and the unit pixel blocks 121 are connected to the pixel signal line 111 via the selection transistor t31 provided for each of the unit pixel blocks 121. Accordingly, since the parasitic capacitance of the pixel signal line 111 can be reduced, signals can be read to the pixel signal line 111 at a higher speed and the horizontal-stripe noise etc. can be suppressed.

In the present embodiment, it is not necessary to adopt the block configuration for the secondary memory unit 150.

Figure 8:
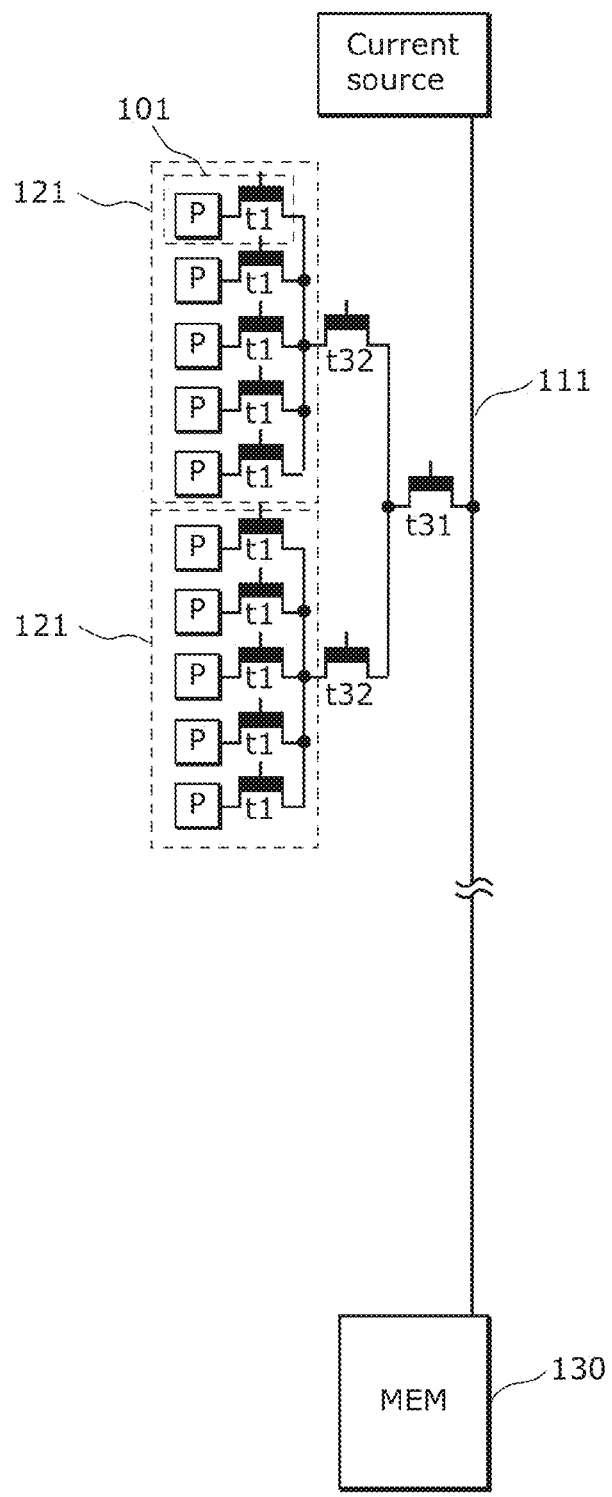
FIG. 8 shows a configuration of a modification of a pixel unit of the solid-state imaging device according to Embodiment 3.

Furthermore, in the present embodiment, the block configuration of the pixel unit 110 of the solid-state imaging device is not limited to a single-stage configuration but may be of multiple-stage configuration. For example, the pixel unit 110 may be of two-stage configuration as shown in FIG. 8. In this configuration, a selection transistor t32 is provided between the selection transistor t31 and the row selection transistor t1.

Furthermore, although each of the columns of the unit pixels 101 includes a plurality of unit pixel blocks 121 in the present embodiment, it may include at most a single pixel block. Specifically, at most a single selection transistor t31 may be provided for a column of the unit pixels 101.

Embodiment 4

Figure 9:
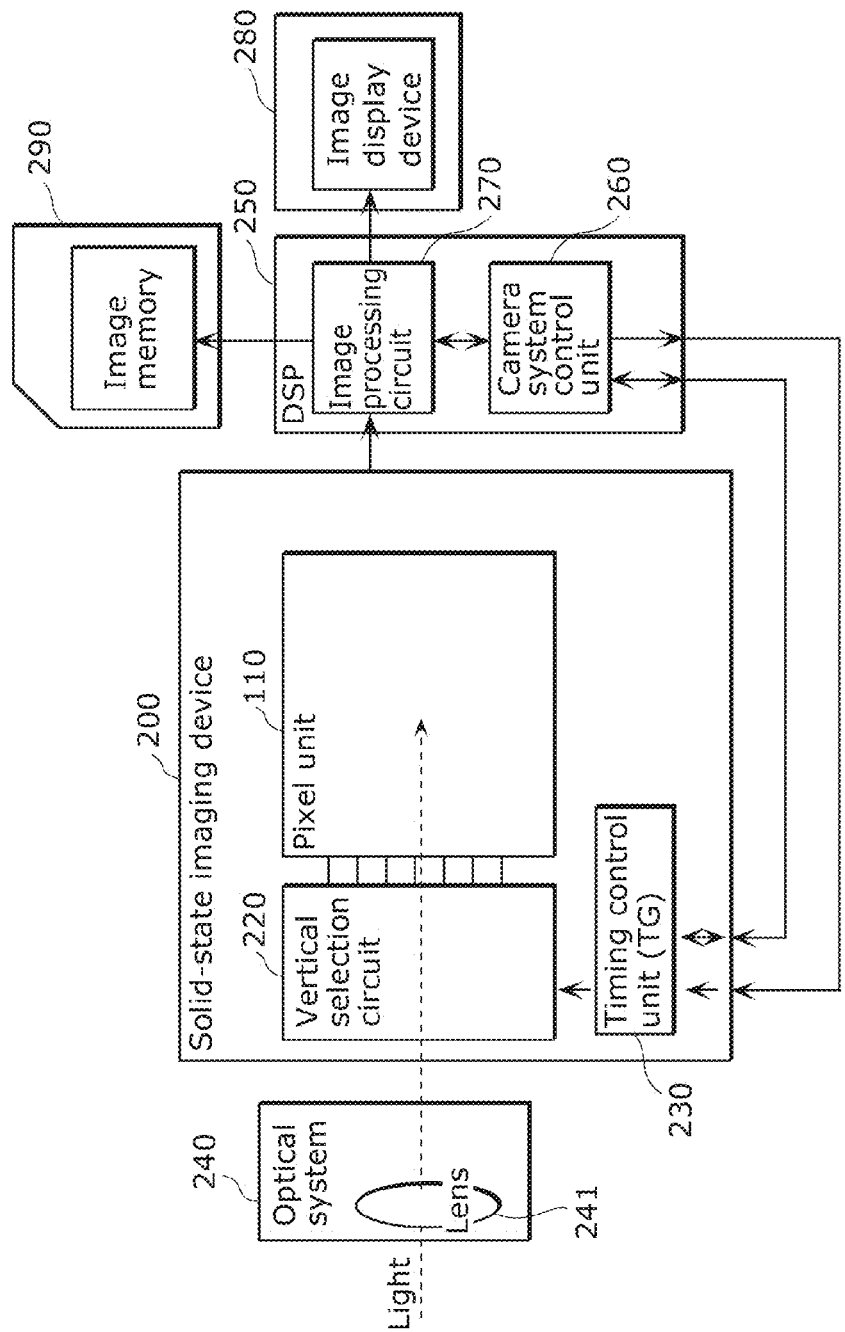
FIG. 9 shows an entire configuration of an imaging device according to Embodiment 4.
Figure 10:
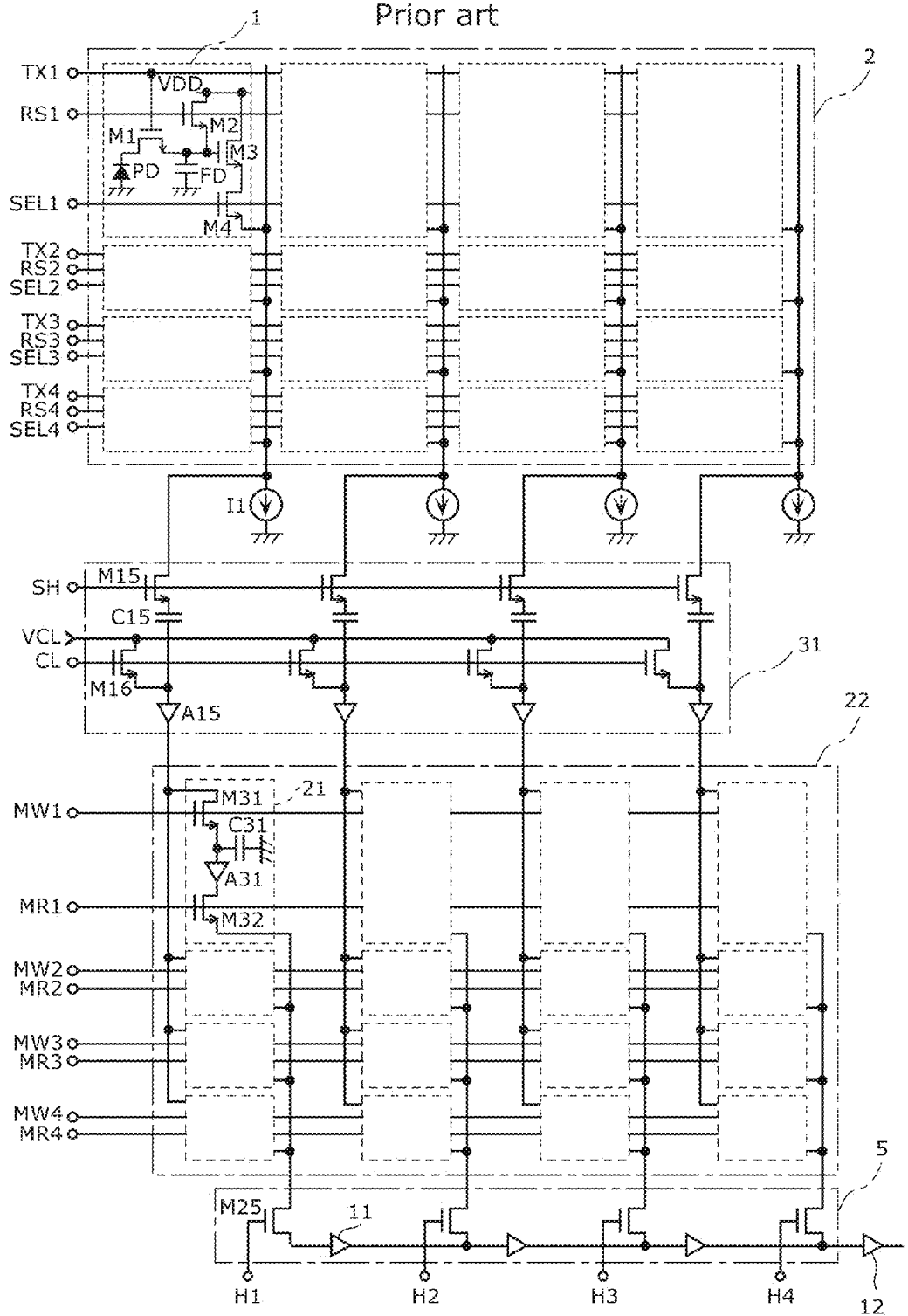
FIG. 10 shows a solid-state imaging device of PTL 1.

FIG. 9 shows an entire configuration of an imaging device (camera system) according to Embodiment 4.

This imaging device roughly includes: a solid-sate imaging device 200, an optical system 240, a digital signal processor (DSP) 250, an image display device 280 such as a liquid crystal screen etc., and an image memory 290.

The optical system 240 includes a lens 241 which collects light from an object and forms an image on a pixel unit 110 of the solid-state imaging device 200.

The solid-state imaging device 200 is the solid-state imaging device described in Embodiments 1 to 3. The solid-state imaging device 200 includes: a pixel unit 110 in which a plurality of unit pixels 101 is arranged in rows and columns; a vertical selection circuit 220 which selects the unit pixels 101 of the pixel unit 110 on a row-by-row basis and controls resetting and signal reading of the unit pixels 101 by outputting a control signal; and a timing control unit 230 which supplies a driving pulse to the vertical selection circuit 220.

The DSP 250 includes a camera system control unit 260 and an image processing circuit 270.

The image processing circuit 270 receives digital pixel signals output from the solid-state imaging device 200 and performs processing such as gamma correction, color interpolation, spatial interpolation, auto white balance, and so on, which are required as camera signal processing. In addition, the image processing circuit 270 performs: conversion into a compression format such as JPEG, recording to the image memory 290, and signal processing for displaying on an image display device 280.

An example of the camera system control unit 260 includes a microcomputer which integrates the whole operation of the imaging device by controlling the optical system 240, the solid-state imaging device 200, and the image processing circuit 270, according to various setting designated through a user interface (I/F) (not shown). For example, the user I/F receives, as an input, a real-time instruction such as change of the zoom magnification and instruction from a release button, and the camera system control unit 260 changes the zoom magnification of the lens 241, runs the curtain shutter, and controls the reset scanning of the solid-state imaging device 200.

The above has described the solid-state imaging device, the method for driving the solid-state imaging device, and the imaging device according to the present disclosure based on the embodiments. However, the present disclosure is not limited to these embodiments. Although only some exemplary embodiments of the present disclosure have been described in detail above, those skilled in the art will readily appreciate that many modifications are possible in the exemplary embodiments without materially departing from the novel teachings and advantages of the present disclosure. Moreover, structural elements in the embodiments may be optionally combined without departing from the spirit of the prevent disclosure.

INDUSTRIAL APPLICABILITY

The present disclosure can be used for a solid-state imaging device, a method for driving the solid-state imaging device, and an imaging device, and particularly for a digital still camera, a digital video camera, and a mobile phones with camera, and is commercially useful.

The invention claimed is:

1. A solid-state imaging device comprising:
a pixel unit in which a plurality of unit pixels is arranged in rows and columns, the unit pixels performing photoelectric conversion of incident light to generate pixel information;
a primary memory unit including a plurality of first unit memories arranged in rows and columns, and
a secondary memory unit in which a plurality of secondary unit memory blocks are arranged in rows and columns,
wherein pixel information stored in the primary memory unit is written into the secondary memory unit, and each of the secondary unit memory blocks includes a plurality of secondary unit memories which are connected in parallel to each other,
the secondary memory unit includes:
a memory signal line; and
a plurality of first selection switches (i) disposed in each column of the secondary memory unit and between the secondary unit memory blocks and the memory signal line, (ii) connected in parallel to each other, and (iii) each shared by the plurality of secondary unit memories in a corresponding one of the secondary unit memory blocks,
the memory signal line is connected to the secondary unit memory blocks via the first selection switches, and
each of the secondary unit memories includes a write transistor, a capacitor, and a read transistor.

2. The solid-state imaging device according to claim 1, wherein the memory signal line is shared by a plurality of columns of the secondary memory unit.

3. The solid-state imaging device according to claim 1, further comprising a signal driving unit configured to write the pixel information into the secondary memory unit,
wherein the signal driving unit is shared by a plurality of columns of the secondary memory unit.

4. The solid-state imaging device of claim 1,
wherein each of the columns of the unit pixels includes the plurality of unit pixels in the column as a unit pixel block,
the pixel unit includes:
a pixel signal line disposed in each of the columns of the unit pixels; and
a second selection switch disposed between the unit pixel block and the pixel signal line, and shared by the plurality of unit pixels in the unit pixel block.

5. The solid-state imaging device according to claim 4,
wherein each of the unit pixels includes:
a photoelectric conversion element which performs photoelectric conversion of the incident light to generate signal charges;
an amplifying transistor which outputs a signal voltage corresponding to an amount of the signal charges as the pixel information; and
a row selection transistor which causes the signal voltage to be output to the pixel signal line.

6. The solid-state imaging device according to claim 1,
wherein the pixel information is sent from the memory signal line to the secondary unit memory blocks.

7. A method for driving a solid-state imaging device,
the solid-state imaging device including:
a pixel unit in which a plurality of unit pixels is arranged in rows and columns, the unit pixels performing photoelectric conversion of incident light to generate pixel information;
a primary memory unit including a plurality of first unit memories arranged in rows and columns, and
a secondary memory unit in which a plurality of secondary unit memory blocks are arranged in rows and columns,
wherein pixel information stored in the primary memory unit is written into the secondary memory unit, and each of the secondary unit memory blocks includes a plurality of secondary unit memories which are connected in parallel to each other,
the secondary memory unit including:
a memory signal line provided for each of the columns in the memory unit; and
a plurality of first selection switches (i) provided in each column of the secondary memory unit and between the secondary unit memory blocks and the memory signal line, (ii) connected in parallel to each other, and (iii) each shared by the plurality of secondary unit memories in a corresponding one of the secondary unit memory blocks,
the memory signal line being connected to the secondary unit memory blocks via the selection switches, and
the memory signal line being shared by a plurality of columns of the secondary memory unit,
the method for driving the solid-state imaging device comprising turning ON different selection switches provided between the memory signal line and the secondary unit memory blocks in a different column sharing the memory signal line, at different timing.

8. The method for driving a solid-state imaging device according to claim 7,
the solid-state imaging device further including a signal driving unit configured to write the pixel information into the secondary memory unit,
the signal driving unit being shared by a plurality of columns of the secondary memory unit and a plurality of columns of the pixel unit,
the method for driving the solid-state imaging device further comprising selectively inputting, to the signal driving unit, the pixel information of each of the unit pixels in different columns at different timing.

9. The method for driving a solid-state imaging device according to claim 8, wherein a driving frequency for driving the signal driving unit is a multiplication of a fundamental frequency for reading the pixel information from the pixel unit to the signal driving unit.

10. The method for driving a solid-state imaging device according to claim 7, wherein the pixel information is sent from the memory signal line to the secondary unit memory blocks.

11. An imaging device comprising:
the solid-state imaging device according to claim 1.

12. An imaging device comprising:
the solid-state imaging device according to claim 4.

13. A solid-state imaging device comprising:
a pixel unit in which a plurality of unit pixels is arranged in rows and columns, the unit pixels performing photoelectric conversion of incident light to generate pixel information;
a primary memory unit including a plurality of first unit memories arranged in rows and columns, and
a secondary memory unit in which a plurality of secondary unit memory blocks are arranged in rows and columns,
wherein pixel information stored in the primary memory unit is written into the secondary memory unit, and each of the secondary unit memory blocks includes a plurality of secondary unit memories which are connected in parallel to each other,
the secondary memory unit includes:
a memory signal line; and
a plurality of first selection switches (i) disposed in each column of the secondary memory unit and between the secondary unit memory blocks and the memory signal line, (ii) connected in parallel to each other, and (iii) each shared by the plurality of secondary unit memories in a corresponding one of the secondary unit memory blocks,
the memory signal line is connected to the secondary unit memory blocks via the first selection switches.

14. The solid-state imaging device according to claim 13, wherein the pixel information is sent from the memory signal line to the secondary unit memory blocks.

15. The solid-state imaging device according to claim 13, wherein the memory signal line is shared by a plurality of columns of the secondary memory unit.

16. The solid-state imaging device according to claim 13, further comprising:
a signal driving unit configured to write the pixel information into the secondary memory unit,
wherein the signal driving unit is shared by a plurality of columns of the secondary memory unit.

17. The solid-state imaging device of claim 13,
wherein each of the columns of the unit pixels includes the plurality of unit pixels in the column as a unit pixel block,
the pixel unit includes:
a pixel signal line disposed in each of the columns of the unit pixels; and
a second selection switch disposed between the unit pixel block and the pixel signal line, and shared by the plurality of unit pixels in the unit pixel block.

18. The solid-state imaging device according to claim 17, wherein each of the unit pixels includes:
a photoelectric conversion element which performs photoelectric conversion of the incident light to generate signal charges;
an amplifying transistor which outputs a signal voltage corresponding to an amount of the signal charges as the pixel information; and
a row selection transistor which causes the signal voltage to be output to the pixel signal line.

* * * * *